United States Patent
Barrow

(10) Patent No.: US 6,297,078 B1
(45) Date of Patent: *Oct. 2, 2001

(54) INTEGRATED CIRCUIT PACKAGE WITH BOND WIRES AT THE CORNERS OF AN INTEGRATED CIRCUIT

(75) Inventor: Michael Barrow, El Dorado Hills, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/001,636

(22) Filed: Dec. 31, 1997

(51) Int. Cl.[7] .......................... H01L 21/44; H01L 21/48; H01L 21/50; H01L 23/495; H01L 23/22
(52) U.S. Cl. .......................... 438/127; 438/112; 438/124; 438/126; 257/667; 257/687; 257/773; 257/784; 257/787
(58) Field of Search .................. 257/666, 667, 257/687, 787, 788, 795, 690, 780, 786, 781, 784, 773; 438/121, 127, 112, 124, 126

(56) References Cited

U.S. PATENT DOCUMENTS

| | | | |
|---|---|---|---|
| 4,928,162 | * 5/1990 | Lesk et al. | 257/738 |
| 5,045,919 | * 9/1991 | Nagaoka | 357/72 |
| 5,296,743 | * 3/1994 | Nguyen et al. | 257/784 |
| 5,457,340 | * 10/1995 | Templeton, Jr. et al. | 257/666 |
| 5,508,556 | * 4/1996 | Lin | 257/691 |
| 5,563,446 | * 10/1996 | Chia et al. | 257/787 |
| 5,565,709 | * 10/1996 | Fukushima et al. | 257/787 |
| 5,596,227 | * 1/1997 | Saito | 257/787 |
| 5,684,332 | * 11/1997 | Chen et al. | 257/786 |
| 5,780,772 | * 7/1998 | Singh et al. | 174/52.2 |
| 5,843,808 | * 12/1998 | Karnezos | 438/121 |

* cited by examiner

Primary Examiner—Wael Fahmy
Assistant Examiner—Neal Berezny
(74) Attorney, Agent, or Firm—Blakely, Sokoloff, Taylor & Zafman LLP

(57) ABSTRACT

An integrated circuit package which has an integrated circuit mounted to a substrate. The package includes a plurality of bond wires that couple bond pads of the integrated circuit to corresponding bond pads of the substrate. The bond wires may have an essentially uniform bond wire density about an entire outer perimeter of the integrated circuit including the corners of the circuit. The integrated circuit and bond wires are enclosed by an injected molded plastic housing. It is believed that the bond wires located at the corners impede the flow of the injected plastic and reduce the amount of wire sweep in the package from packages in the prior art. Additionally, the essentially uniform bond wire density may create a uniform fluidic resistance to the injected plastic. The uniform resistance also reduces the amount of wire sweep from packages in the prior art. The bond wires located at the corners may be dummy wires that are not electrically connected to the integrated circuit.

4 Claims, 2 Drawing Sheets

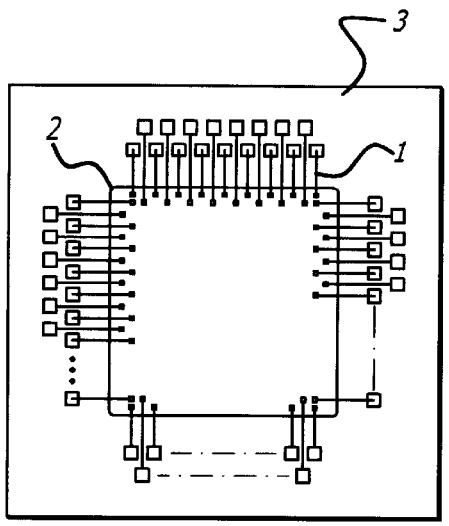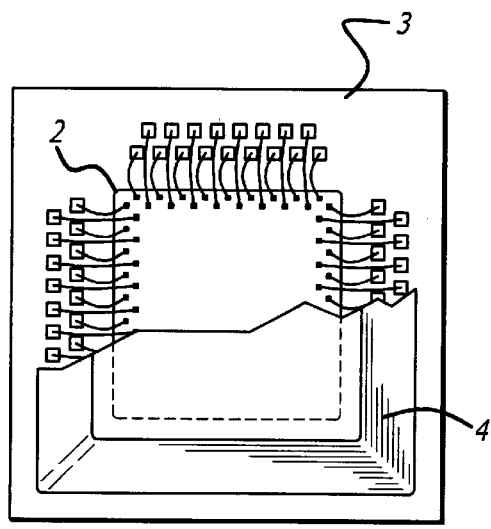
FIG. 1
Prior Art
FIG. 2
Prior Art
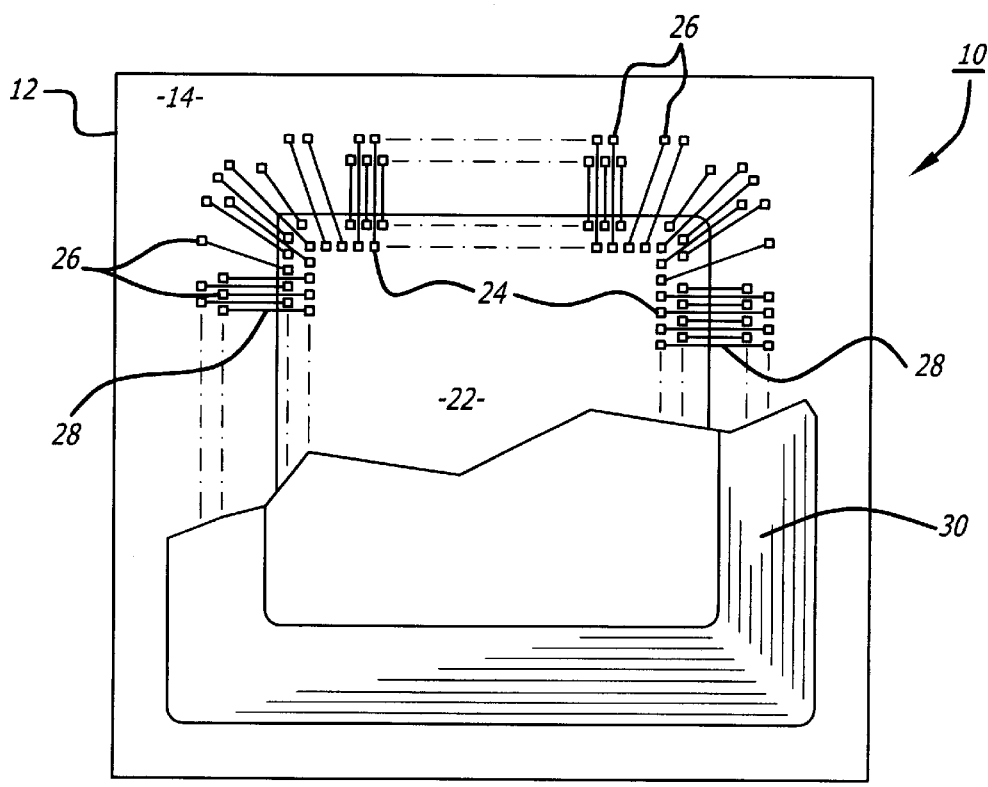
FIG. 3

INTEGRATED CIRCUIT PACKAGE WITH BOND WIRES AT THE CORNERS OF AN INTEGRATED CIRCUIT

BACKGROUND OF THE INVENTION

1. Field of the Invention

The present invention relates to an integrated circuit package.

2. Background Information

Integrated circuits are typically assembled into a package that is soldered to a printed circuit board. There are many types of integrated circuit packages including ball grid array (BGA) packages. BGA packages include a plurality of solder balls that are attached to a substrate. The solder balls are eventually reflowed to mount the package to a printed circuit board.

An integrated circuit is mounted to the BGA package substrate and typically wire bonded to bond pads of the substrate. The bonded integrated circuit and substrate are then placed into a mold that is injected with a plastic material. The injected plastic encloses both the integrated circuit and the bond wires.

FIG. 1 shows a typical wire bonded BGA package which has a number of wire bonds 1 that couple an integrated circuit 2 to a substrate 3 before the injection of plastic. The plastic is typically introduced through a gate at the corner(s) of the integrated circuit. The plastic is injected into the mold at very high pressures to insure that the integrated circuit is completely encapsulated.

As shown in FIG. 2, it has been found that the injected plastic 4 creates a "wire sweep" in the bond wires 1. A significant wire sweep can break the bond wires and create a defective part. It would be desirable to provide an injection molded wire bonded package that is less susceptible to wire sweep than packages in the prior art.

SUMMARY OF THE INVENTION

An integrated circuit package which has an integrated circuit mounted to a substrate. The package includes a plurality of bond wires that couple bond pads of the integrated circuit to corresponding bond pads of the substrate. The bond wires may have an essentially uniform bond wire density about an entire outer perimeter of the integrated circuit. The integrated circuit and bond wires are enclosed by a housing.

BRIEF DESCRIPTION OF THE DRAWINGS

FIG. 1 is a top view of an integrated circuit package of the prior art;

FIG. 2 is a sectional view of the integrated circuit package of FIG. 1 with a housing that encloses an integrated circuit and a plurality of bond wires of the package;

FIG. 3 is a top view of an embodiment of an integrated circuit package of the present invention;

DETAILED DESCRIPTION OF THE INVENTION

One embodiment of the present invention is an integrated circuit package which has an integrated circuit mounted to a substrate. The package includes a plurality of bond wires that couple bond pads of the integrated circuit to corresponding bond pads of the substrate. The bond wires may have an essentially uniform bond wire density about an entire outer perimeter of the integrated circuit including the corners of the circuit. The integrated circuit and bond wires are enclosed by an injected molded plastic housing.

It is believed that the bond wires located at the corners of the integrated circuit impede the flow of the injected plastic and reduce the amount of wire sweep in the package from packages in the prior art. Additionally, the essentially uniform bond wire density may create a uniform fluidic resistance to the injected plastic. The uniform resistance also reduces the amount of wire sweep from packages in the prior art. The bond wires located at the corners may be dummy wires that are not electrically connected to the integrated circuit.

Figure 4:
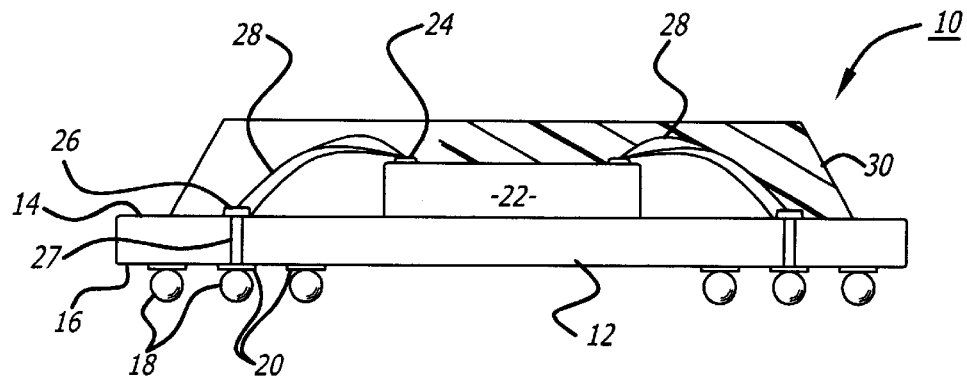
FIG. 4 is a side view of the integrated circuit package FIG. 3.

Referring to the drawings more particularly by reference numbers, FIGS. 3 and 4 show one embodiment of an integrated circuit package 10 of the present invention. The package 10 includes a substrate 12 which has a first surface 14 and an opposite second surface 16. The package 10 may have a plurality of solder balls 18 that are attached to a number of corresponding contact pads 20 of the substrate 12. The solder balls 18 can be reflowed to attach the package 10 to a printed circuit board (not shown). Although solder balls 18 are shown and described, it is to be understood that the package 10 may have other types of contacts such as pins which extend from the second surface 16 of the substrate 12.

An integrated circuit 22 is mounted to the first surface 14 of the substrate 12. The integrated circuit 22 may have a plurality of bond pads 24 that extend about the outer perimeter of the circuit 22. The first surface 14 of the substrate 12 may also have a plurality of bond pads 26 arranged in a pattern about the integrated circuit 22. The bond pads 26 are coupled to the contact pads 20 by vias 27 that extend through the substrate 12.

The package 10 includes a plurality of bond wires 28 that couple the bond pads 24 of the integrated circuit 22 to the bond pads 26 of the substrate 12. The integrated circuit 22 and bond wires 28 are enclosed by a housing 30. The housing 30 is typically constructed from an injected molded plastic material.

In one embodiment, there is an essentially uniform bond wire density about the integrated circuit. The bond wire density may be defined as the number of wires per cubic millimeters. The bond pads 26 and/or 24 and corresponding bond wires located at the corners of the integrated circuit 22 may be "dummy" wires that are not electrically connected to the circuit 22. The dummy wires are primarily provided to impede the flow of the injected plastic material that forms the housing 30 and to minimize the amount of wire sweep in the package 10. Alternatively, the corner wires may be dedicated to electrical power or electrical ground.

Figure 5:
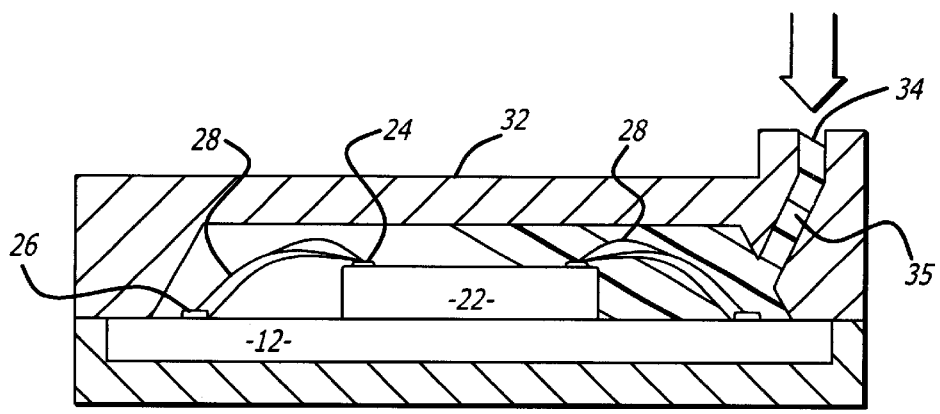
FIG. 5 is a top view of a subassembled integrated circuit package within a mold that is being injected with a plastic material.

To assemble the package 10, the integrated circuit 22 is mounted to the substrate 12 and wire bonded to the bond pads 26. As shown in FIG. 5, the substrate 12 and wire bonded integrated circuit 22 are placed within a mold 32 that has a gate 34. Plastic material 35 is injected through the gate 34 and into the mold 32. It is believed that the bond wires 28 impede the flow of the plastic and reduce the amount of wire sweep over packages in the prior art.

The plastic 35 is injected until the integrated circuit 22 and bond wires 28 are completely encapsulated. After the plastic hardens the substrate 12 and plastic enclosed integrated circuit are removed from the mold 32. The solder balls 18 are then attached to the substrate 12. The solder balls 18 are eventually reflowed to attach the package 10 to a printed circuit board.

Figure 6:
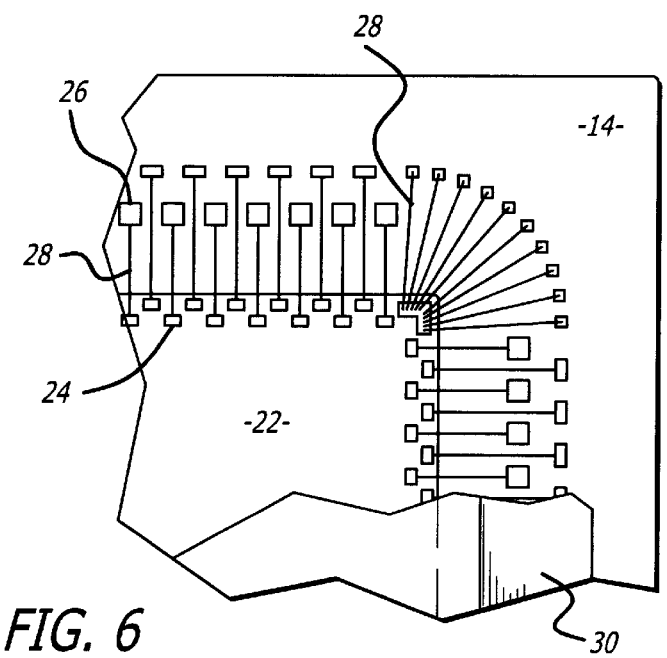
FIG. 6 is a top view of an integrated circuit package with an alternate bond wire pattern.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, as shown in FIG. 6, the bond wires 28 located at the corner of the integrated circuit 22 may of a higher density and more closely spaced together than the wires 28 at the other portions of the circuit 22. For example, each corner may have two or more bond wires 28. The number, spacing and density of bond wires 28 can be selected to control the fluidic resistance within the mold 32 and the wire sweep of the package 10.

What is claimed is:

1. A method for designing an integrated circuit package, comprising:

designing a substrate that has a plurality of bond pads;

selecting an integrated circuit that is to be mounted to the substrate, the integrated circuit having a plurality of corners and a plurality of bond pads that extend about an outer perimeter of the integrated circuit in an essentially uniform manner including the corners, at least two bond pads being located at each corner;

injecting plastic into a mold to enclose the integrated circuit and the bond wires to create a housing; and selecting a number of bond wires that are to be coupled to the bond pads of the integrated circuit and the bond pads of the substrate, the bond wires having an essentially uniform bond wire density about the entire perimeter of the integrated circuit in an essentially uniform manner including the corners, at least two bond wires being located at each corner of the integrated circuit, the bond wires located at the corners to impede the flow of the plastic and reduce the amount of wire sweep.

2. The method of claim 1, wherein a number of bond wires will not carry current between the bond pads of the substrate and the integrated circuit.

3. The method of claim 1, wherein the bond wires will have a uniform bond wire density defined by a number of bond wires per cubic millimeters.

4. The method of claim 1, wherein a plurality of solder balls are attached to the substrate.

* * * * *